United States Patent [19]
Lin et al.

[11] Patent Number: 5,539,567
[45] Date of Patent: Jul. 23, 1996

[54] PHOTOLITHOGRAPHIC TECHNIQUE AND ILLUMINATOR USING REAL-TIME ADDRESSABLE PHASE SHIFT LIGHT SHIFT

[75] Inventors: Tsen-Hwang Lin; Shane R. Palmer, both of Dallas, Tex.; Steven C. Gustafson, Kettering, Ohio; Jay M. Brown, Denison, Tex.

[73] Assignee: Texas Instruments Incorporated, Dallas, Tex.

[21] Appl. No.: 260,389

[22] Filed: Jun. 16, 1994

[51] Int. Cl.⁶ .................................................. G02F 1/09
[52] U.S. Cl. .................... 359/281; 359/254; 359/315; 359/316; 359/245; 359/295; 372/27
[58] Field of Search ........................ 369/281; 385/1, 385/4, 5, 15, 28; 372/26, 27; 359/279, 291, 294, 295, 212, 223, 315, 316, 254, 263, 245

[56] References Cited

U.S. PATENT DOCUMENTS

| | | |
|---|---|---|
| 3,746,785 | 7/1973 | Goodrich .................................. 359/291 |
| 3,884,549 | 5/1975 | Wang et al. ................................ 385/4 |
| 3,970,959 | 7/1976 | Wang et al. ................................ 385/28 |
| 4,492,435 | 1/1985 | Banton et al. ........................... 359/295 |
| 4,698,602 | 10/1987 | Armitage .................................. 359/294 |
| 5,061,048 | 10/1991 | Hayden et al. ........................... 359/315 |
| 5,093,747 | 3/1992 | Dorschner ................................ 359/316 |
| 5,122,894 | 6/1992 | Grantham ................................ 359/245 |
| 5,150,241 | 9/1992 | Joffre et al. .............................. 359/315 |
| 5,153,688 | 10/1992 | Oda et al. ................................ 359/281 |
| 5,255,118 | 10/1993 | Hecht ...................................... 359/254 |

*Primary Examiner*—Loha Ben
*Attorney, Agent, or Firm*—Charles A. Brill; James C. Kesterson; Richard L. Donaldson

[57] ABSTRACT

A phase shift illuminator (700) is comprised of a light source (704) and a phase modulator (716), typically a flexure beam micromirror array, which transversely modulates the incident light beam. When a flexure beam micromirror array is used as the phase modulator (716) a polarizing beam splitter (712) and a quarter-wave plate (714) are used to separate the incident and reflected light beams. The phase modulated light beam (720) from the optical illuminator may be used in optical lithography by passing the light beam through a lithography mask (724), typically after the light beam is phase modulated, and focusing the light beam onto a target wafer (726).

19 Claims, 7 Drawing Sheets

PHOTOLITHOGRAPHIC TECHNIQUE AND ILLUMINATOR USING REAL-TIME ADDRESSABLE PHASE SHIFT LIGHT SHIFT

TECHNICAL FIELD OF THE INVENTION

This invention relates to optical lithography and more particularly to optical lithography of semiconductor substrates.

BACKGROUND OF THE INVENTION

Advances in integrated circuit manufacturing have been closely tied to advances in the related arts on which integrated circuit manufacturing depends. One of the fundamental processes used in the manufacture of integrated circuits is optical lithography. Optical lithography uses visible or ultraviolet radiation to selectively expose portions of a photoresist which has been deposited onto a semiconductor wafer. After the photoresist has been selectively exposed, it is developed, to remove either the exposed or unexposed photoresist, thereby forming a bas-relief image on the surface of the wafer. Photoresists that become more soluble in a developer after they are exposed are called positive resists. Photoresists that are less soluble after being exposed are called negative resists. Each area of the image on the wafer may define a component, or feature, of the circuit being fabricated. Features typically include both semiconductor components, such as a transistor gate, and metal components such as interconnects.

The developed photoresist remaining on the wafer forms a mask which protects the surface below the photoresist from subsequent process steps. For example, if a wafer with a photoresist mask is exposed to a dopant, only the portions of the wafer not covered by the mask would receive the dopant. Likewise, if a masked wafer with a metal surface layer is etched, only the unmasked portions of the metal layer are etched away leaving the masked or protected portions to form interconnects between circuit elements.

One of the major benefits from improved lithography processes is the reduction in size of semiconductor circuitry. As the size of the circuitry has been reduced, both the amount of circuitry that can be built on a given substrate and the operating speed of the circuitry have increased. As the amount of circuitry on a substrate and the speed of the circuitry have both increased, the circuitry cost has decreased, increasing economically feasible applications. Thus, the reduction in circuitry size has played a major role in the growth of the semiconductor industry.

As devices become smaller, it is more difficult to produce the lithography masks required to image the circuitry with adequate image resolution and contrast. This is especially true when using lithography techniques, such as contact printing, where the lithography mask is in direct contact with the wafer and must therefore have the same feature size as the target circuitry.

Projection lithography separates the mask from the wafer and uses lenses to focus the light passing through the mask onto the wafer. The lenses between the lithography mask and the wafer may also reduce the size of the projected image of the mask to allow the use of an oversized lithography mask. However, because the lithography mask is not against the wafer, light that is diffracted by one aperture of the lithography mask may interfere with light from another aperture of the lithography mask. The light interferes both constructively to create bright regions where there should be dark regions, and destructively to create dark regions where there should be light regions. This is especially significant at or beyond the Airy limit when the light from two adjacent apertures constructively interferes and exposes the photoresist between the apertures.

To prevent the constructive interference of two adjacent features, a phase shifting mask is sometimes used. The phase shifting mask reduces the problems of constructive interference but has the disadvantage of requiring a more complex lithography mask. Furthermore, the benefits of phase shifting lithography masks are difficult to achieve with some circuitry patterns. For example, a 'U' shaped feature having a phase shifter on one vertical segment to avoid constructive interference with the other vertical segment will cause destructive interference to occur on the short horizontal segment where the phase shifter ends, leaving an inadvertently unexposed portion. Therefore, there is a need in the art for an improved optical lithography process that is capable of forming small circuit features.

SUMMARY OF THE INVENTION

Phase shift masks of the prior art are expensive to manufacture and have a fixed phase shift pattern which typically creates only two unique phases of transmitted light. Depending on the pattern being imaged, a fixed phase shift pattern may create artifacts in the image projected by the phase shift mask. The disclosed invention contemplates, apparently for the first time, separating the phase shifting and spatial filtering functions traditionally performed by a phase shift mask. A phase shift illuminator is taught which generates a phase shifted light beam which may be used to illuminate a lithography photomask.

An optical illuminator according to one embodiment of the disclosed invention comprises a light source for providing a beam of light which is focused onto a phase modulator. The phase modulator modulates the received beam of light, in response to electronic control signals, to generate a phase modulated beam of light. If the optical illuminator is used as part of a lithography system, then the beam of light is also spatially modulated to impart the desired lithography pattern to the beam of light.

The disclosed invention has the advantage of enabling phase shift optical lithography without the need to generate an expensive phase shift photomask. Furthermore, the phase shift imparted to a light beam may be precisely controlled and varied during the operation of the device thereby improving the ability of a phase shift lithography system to create very small image patterns.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE PREFERRED EMBODIMENTS

Figure 1A:
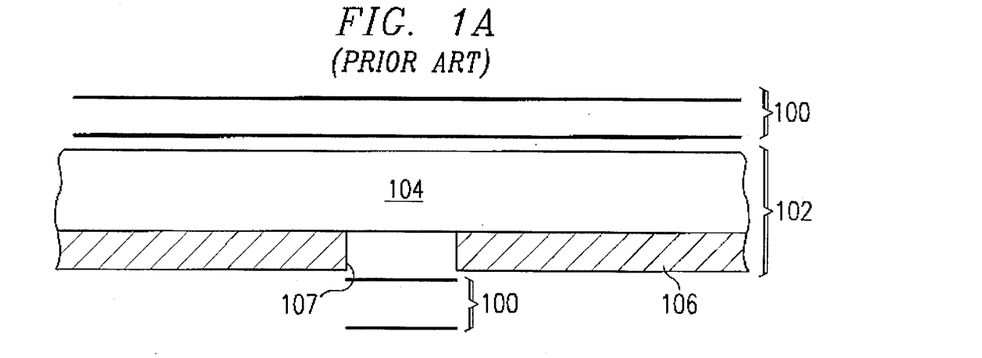
FIG. 1A is a prior art diagrammatic section view of light passing through a lithography mask having a single aperture.
Figure 1B:
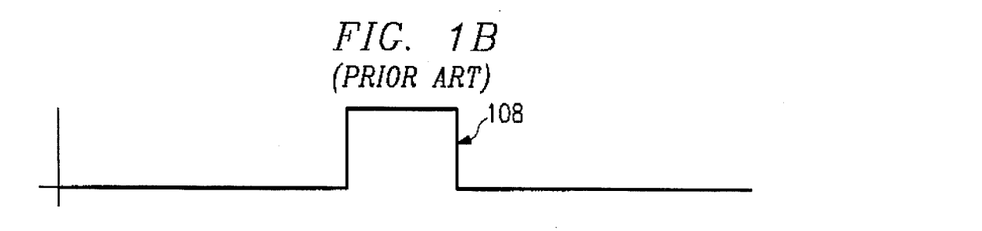
FIG. 1B is a graph of the amplitude of the electric field of the light leaving the lithography mask of FIG. 1A.

FIG. 1A shows the wavefronts of a collimated light beam 100 passing through a lithography mask 102. A lithography mask 102 is a spatial filter that is used to impart a pattern, typically corresponding to one level of a circuit pattern, to a beam of light 100. Typical lithography masks 102, also called photomasks, reticles, or simply masks, are comprised of a substrate 104, typically quartz, that is transparent to the wavelengths of interest, and a layer of an opaque material 106 such as chromium. The opaque material 106 serves to block the light 100 from reaching a target wafer (not shown) onto which the light 100 is focused. Although the target wafer is typically a semiconductor wafer on which a photoresist has been deposited, the target wafer could be any object on which an image may be projected. The opaque material 106 is removed from portions of the mask 102 corresponding to the portions of the target wafer that are to be exposed to the transmitted light. For simplicity, the portion of the lithography mask 102 shown in FIG. 1A has only one small aperture 107 to allow light 100 to pass through the mask 102. The aperture 107 corresponds to a desired feature, such as a transistor gate, on the target wafer that is to receive illumination. Light 100 leaving the lithography mask 102 after passing through aperture 107 has the electric field distribution 108 shown in FIG. 1B.

Figure 1C:
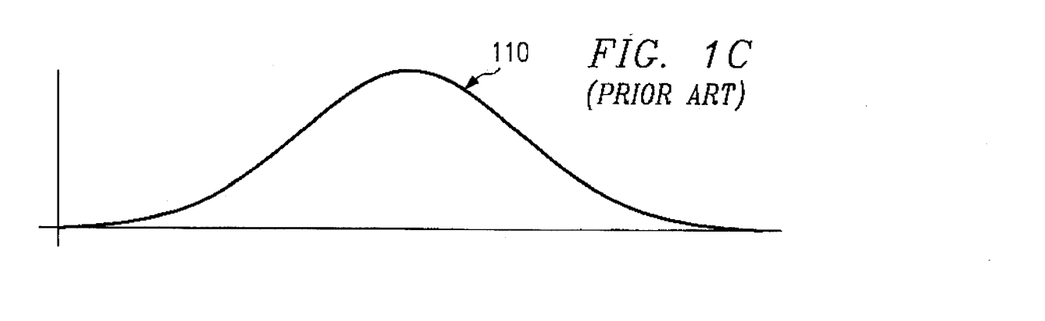
FIG. 1C is a graph of the amplitude of the electric field of the light impinging on a target wafer after passing though the lithography mask which shows the effect of diffraction caused by the mask of FIG. 1A.
Figure 1D:
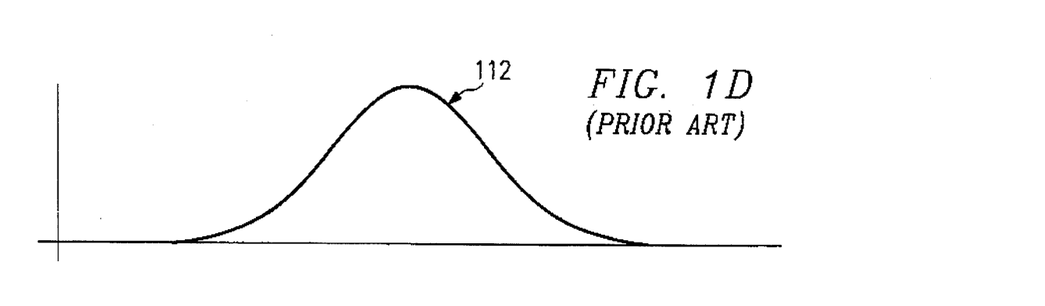
FIG. 1D is a graph of the intensity, equal to the numerical square of the electric field, of the light flux impinging on a target wafer after passing through the lithography mask of FIG. 1A.

The transmitted light 100 is focused onto the target wafer. When the light 100 reaches the target wafer it has an electric field distribution 110, shown in FIG. 1C that may be approximated by a sinc function. The exposure of the photoresist is determined by the intensity of the light 100, which is mathematically equal to the square of the electric field. The intensity distribution 112 of the light 100 impinging on the target wafer after passing through the lithography mask 102 of FIG. 1A is shown in FIG. 1D.

Figure 2A:
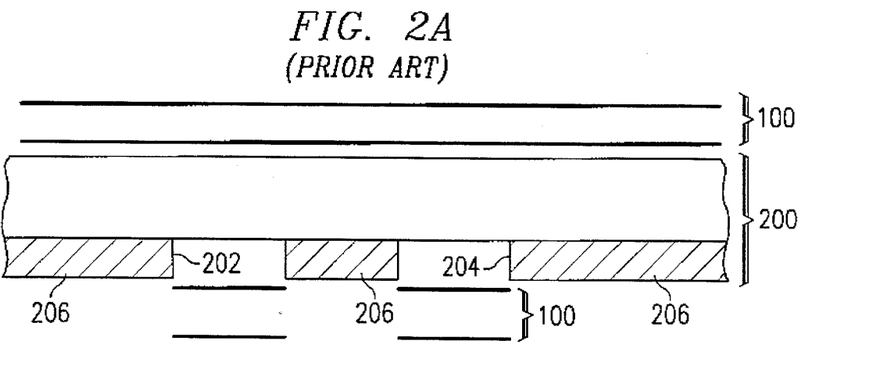
FIG. 2A is a prior art diagrammatic section view of light passing through a lithography mask having two apertures.

FIG. 2A shows a lithography mask 200 with two apertures 202, 204 formed through an opaque material 206. The mask 200 is designed to allow light 100 to reach only the portions of the target wafer that are aligned with the two apertures 202, 204. The electric field distribution 208 of the light 100 passing through the mask apertures 202, 204 is shown leaving the mask 200 in FIG. 2B. If the light 100 passing through the two apertures 202, 204 is in phase, the electric field 210 of the light 100 passing through aperture 202 constructively interferes with the electric field 212 of the light 100 passing through aperture 204 resulting in electric field 214 shown in FIG. 2C. As a result of the constructive interference, the portion of the photoresist on the target water corresponding to the opaque material 206 between the two apertures 202,204 has a greater incident electric field level, shown by line 214, than the electric field incident on the portions of photoresist directly illuminated by either aperture 202, 204.

Figure 2B:
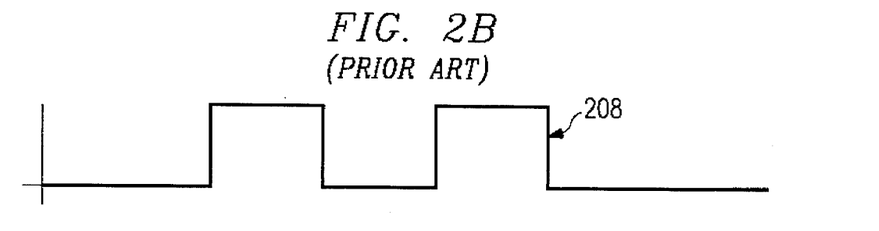
FIG. 2B is a graph of the amplitude of the electric field of the light leaving the lithography mask of FIG. 2A.
Figure 2C:
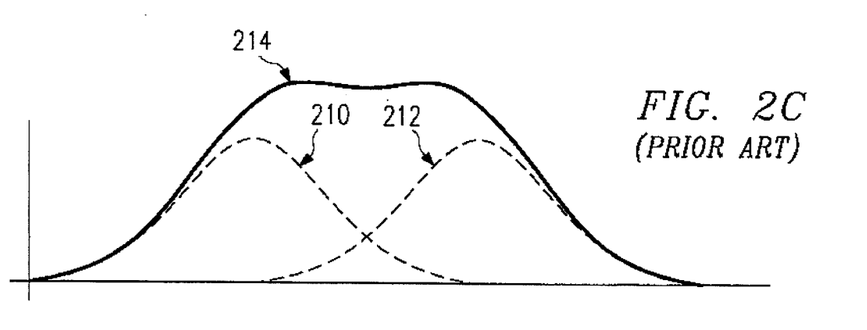
FIG. 2C is a graph of the amplitude of the electric field of the light impinging on a target wafer after passing though the lithography mask which shows the effect of diffraction caused by the mask of FIG. 2A.
Figure 2D:
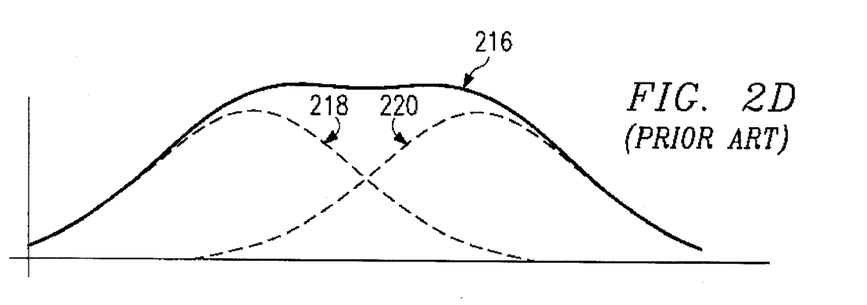
FIG. 2D is a graph of the intensity, equal to the numerical square of the electric field, of the light flux impinging on a target wafer after passing through the lithography mask of FIG. 2A.

FIG. 2D shows the intensity distribution 216 of the light 100 from the two apertures 202, 204 as well as the intensity distributions 218, 220 from either aperture individually. The light 100 diffracted by the two apertures constructively interferes to expose a portion of the target wafer which should be shielded from light 100 by the opaque material 206 between the apertures 202, 204. As shown in FIG. 2D, the light intensity between the two apertures 202, 204 is greater than the maximum direct light intensity from either aperture 202, 204. The intensity level of the light 100 between the apertures 202, 204 is dependent on the distance between the two apertures 202, 204. As the apertures 202, 204 are moved farther apart, the light intensity between the apertures 202, 204 will decrease. However, even a low light intensity level may be sufficient to partially expose unintended portions of the photoresist and render the photoresist ineffective.

Figure 3A:
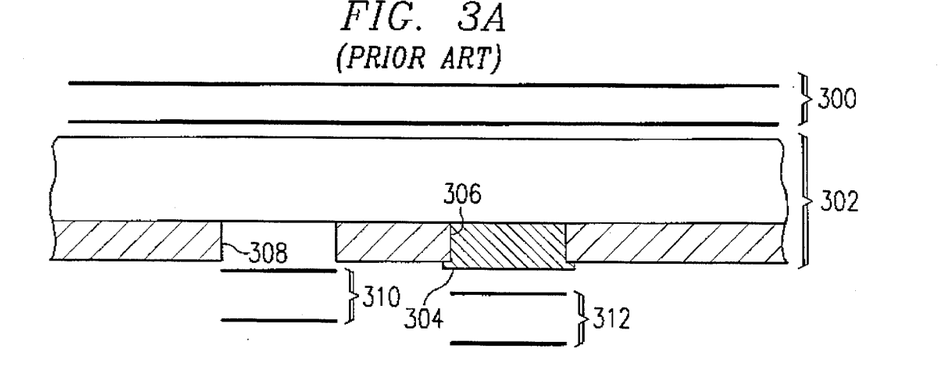
FIG. 3A is a prior art diagrammatic section view of light passing through a lithography mask having two apertures, one of which has an integral 180° phase shifter.
Figure 3B:
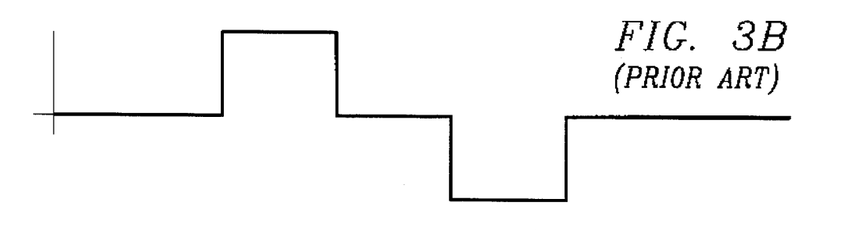
FIG. 3B is a graph of the amplitude of the electric field of the light leaving the lithography mask of FIG. 3A.
Figure 3C:
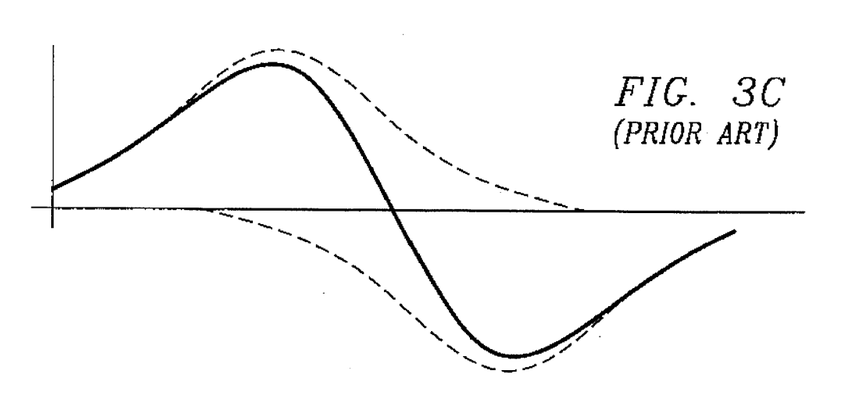
FIG. 3C is a graph of the amplitude of the electric field of the light impinging on a target wafer after passing though the lithography mask which shows the effect of diffraction caused by the mask of FIG. 3A.
Figure 3D:
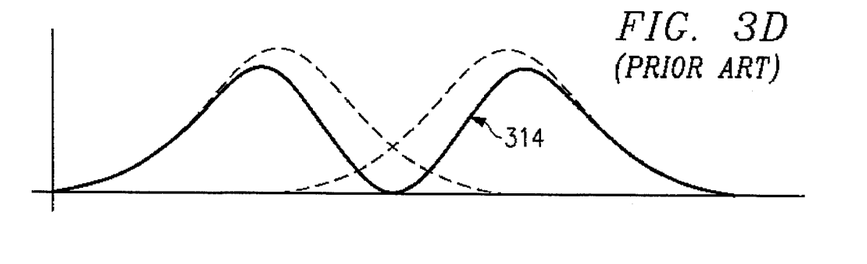
FIG. 3D is a graph of the intensity, equal to the numerical square of the electric field, of the light flux impinging on a target wafer after passing through the lithography mask of FIG. 3A.

FIG. 3A shows a collimated beam of light 300 impinging on a phase shift lithography mask 302 of the prior art. The mask 302 has a phase shifter 304 in the right aperture 306 which serves to delay the light by one-half wavelength compared with aperture 308 on the left. The phase shifter 304 is typically made by depositing an oxide layer of the required thickness over the apertures requiring a phase shift. Because of the phase shifter 304, light 310 leaving the left aperture 308 is now 180° out of phase with the light 312 leaving the aperture 306 on the right. The distributions shown in FIGS. 3B through 3D correspond to those of FIGS. 2B through 2D. Because the light 310, 312 from the two apertures is 180° out of phase, the interference which was constructive in FIGS. 2B through 2D is now destructive, as shown in FIGS. 3B through 3D, which reduces the light intensity 314 in the region on the target wafer between the two apertures 306, 308. This destructive interference improves the isolation of the two features illuminated by the two apertures 306, 308.

Figure 4A:
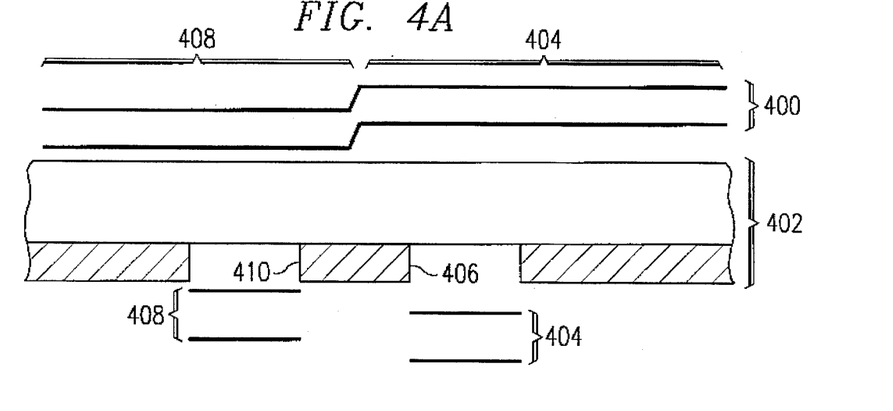
FIG. 4A is a diagrammatic section view of phase shifted light passing through a lithography mask having two apertures.
Figure 4B:
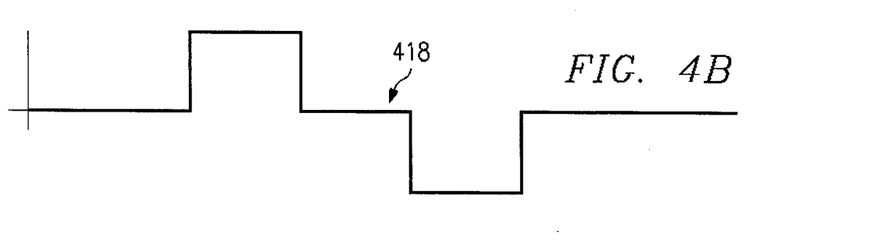
FIG. 4B is a graph of the amplitude of the electric field of the light leaving the lithography mask of FIG. 4A.
Figure 4C:
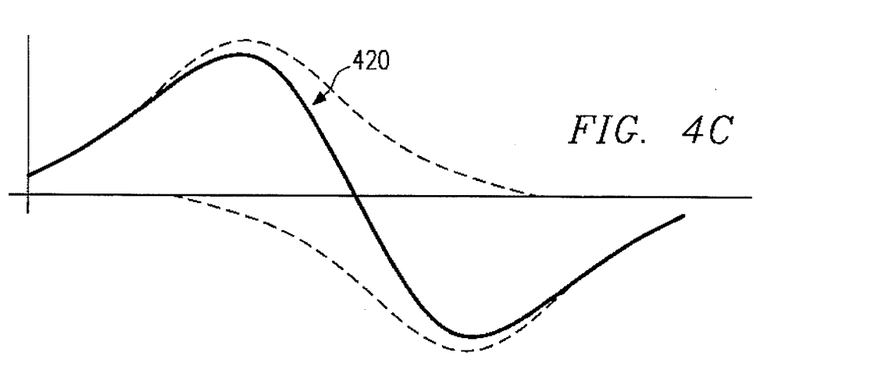
FIG. 4C is a graph of the amplitude of the electric field of the light impinging on a target wafer after passing though the lithography mask which shows the effect of diffraction caused by the mask of FIG. 4A.
Figure 4D:
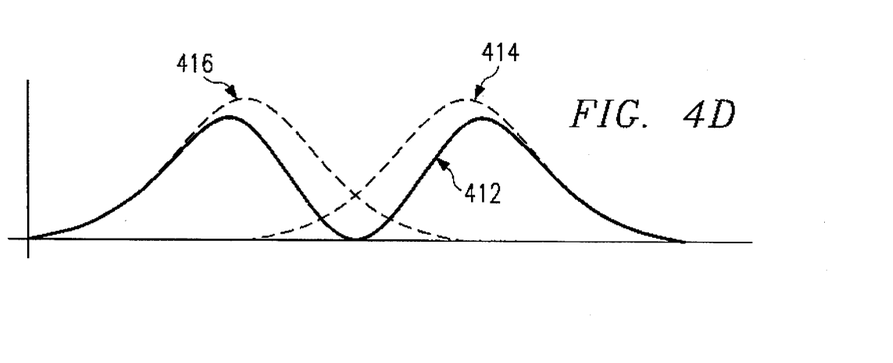
FIG. 4D is a graph of the intensity, equal to the numerical square of the electric field, of the light flux impinging on a target wafer after passing through the lithography mask of FIG. 4A.

As shown in FIG. 3A, typical phase shift lithography masks 302 of the prior art both spatially filter and phase modulate a beam of light 300 passing through the mask 302. The present invention contemplates separating the phase modulation and spatial filtering functions performed by phase shift lithography masks of the prior art. Specifically, a light beam 400 is transversely phase-modulated, that is, its constituent portions or sub-beams have different phases across the beam 400 perpendicular to the direction of its propagation. Transversely phase modulating the portions of the light beam 400 allows the phase-modulated light beam 400 to illuminate a standard lithography mask 402 as shown in FIG. 4A. The phase modulation causes one portion of the beam 400, e.g. that designated by 404, to be out of phase with another portion of the beam 400, e.g. that designated by 408, prior to impinging on, and passing through apertures 406, 410 of the lithography mask 402. Because the lithography mask 402 has a uniform thickness, the phase relationship between the portions 404, 408 of the light beam 400 impinging on the mask 402 are maintained by the light 404, 408 passing through the mask 402. Because the incident light 400 is phase-modulated, the light 404 incident on the right portion of the mask 402 and entering the right aperture 406 and then exiting the right aperture 406 is out of phase with the light 408 entering and exiting the left aperture 410, even though the lithography mask 402 does not include any phase shifters. The intensity distribution 412 of the light passing through lithography mask 402 and striking the target wafer is shown in FIG. 4D. This distribution 412 results from destructive interference between the distributions 414, 416 of the portions 404, 408 at the surface of the photoresist-covered wafer. As can be seen by FIG. 4D, the destructive interference between the two beams of light results the same improved isolation between the two features illuminated by the two apertures 406, 410 as was achieved in FIG. 3D using the phase shift lithography mask 302. Consistent with earlier Figures, the electric field distribution 418 of the light 400 exiting the apertures 406, 410, as light portions 404, 408 is shown in FIG. 4B. The electric field distribution 420 of the light 400 at the photoresist-covered wafer is shown in FIG. 4C. The intensity 412 is the square of the field 420.

Figure 5:
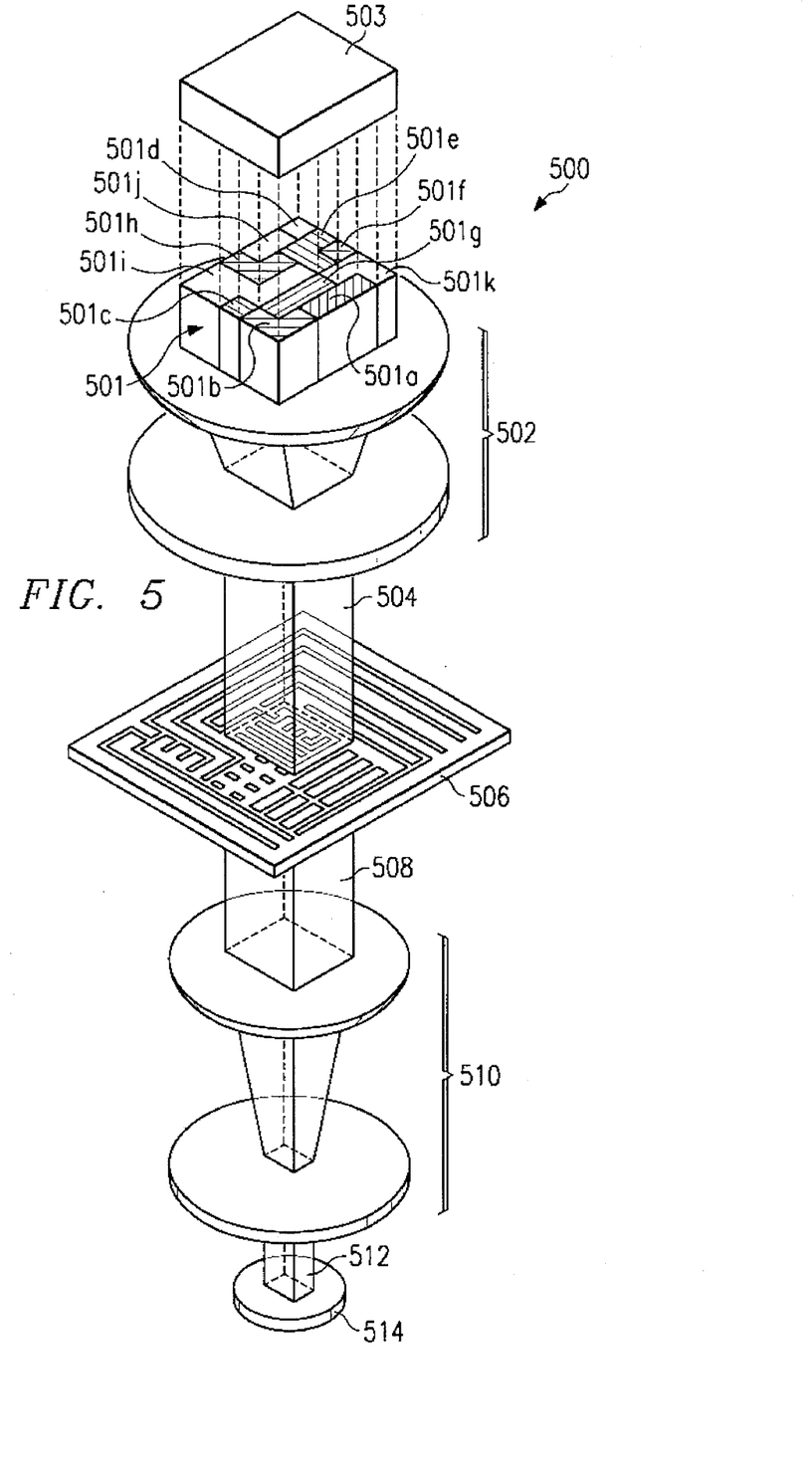
FIG. 5 is a pictorial view of a phase shift lithography system according to a first embodiment of the present invention.

FIG. 5 shows a simplified pictorial view of a phase shift lithography system 500 according to one embodiment of the present invention. A transversely phase-modulated beam of light 501, which includes various portions 501a, 501b, etc. is denoted by various shading, which portions have differing phases transversely of, or across, the beam 501 perpendicular to the propagation direction. The beam 501 is generated by phase shift illuminator 503 and reduced in size and collimated by illuminator lens group 502 to form a collimated beam of light 504 made up of differently phased portions. That is, as in FIG. 4, the light beam 504 is comprised of multiple contiguous parallel portions or sub-beams 501a, 501b, etc. each having a different phase. The various phases of each portion of the input beam of light 501 are represented in FIG. 5 by the various cross-hatched portions of the beam 501. After the beam of light 501 is reduced and collimated, it passes through a lithography mask 506. The mask 506 spatially filters the beam 504 by allowing only selected segments of the beam 504 to pass through the mask 506. The spatially filtered beam 508 is once again reduced and collimated, this time by lens group 510 to form an output beam 512 which impinges a target wafer 514. The target wafer 514 is typically a semiconductor wafer covered with a layer of an organic photoresist but could be any object that it is desired to image.

Figure 6:
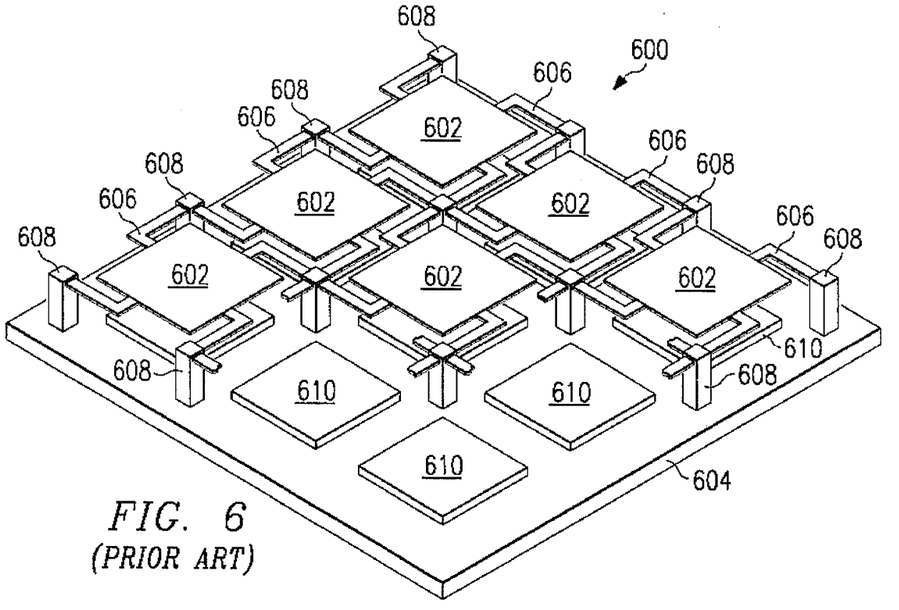
FIG. 6 is a perspective view of a portion of a flexure beam micromirror device array of the prior art which may be utilized to generate the phase modulated wavefront used in the lithography system of FIG. 5.

Any suitable phase modulator may comprise the phase shift illuminator 503 to generate the phase-modulated light beam 501 used by the phase shift lithography system of FIG. 5. Suitable modulators preferably modulate primarily only the phase of the incident light and include some forms of liquid crystal devices (LCD) as well as certain types of micromirror devices. One type micromirror device that is particularly suitable phase modulator is a type of spatial light modulator (SLM) known as a Flexure Beam Micromirror Device (FBMD), which is taught by commonly assigned U.S. Pat. No. 4,954,789 entitled "Spatial Light Modulator," issued Sep. 4, 1990, which patent is incorporated herein by reference. A portion of a flexure beam micromirror array 600 is shown in FIG. 6. Each element in a flexure beam micromirror array typically consists of a square aluminum planar mirror 602 which is suspended above a substrate 604 by four L-shaped flexure hinges 606. Each hinge is attached at one end to the mirror 602 and on the other end to the top of a support post 608. Beneath each mirror 602 is an address electrode 610 formed on substrate 604. A voltage applied between the address electrode 610 and the mirror 602 creates an electrostatic attractive force which causes the mirror 602 to selectively deflect towards the address electrode 610.

Like other types of micromirror devices, flexure beam micromirror arrays can be built that contain tens of thousands of mirror elements 602. However, unlike most other types of micromirror devices and other SLMs, flexure beam micromirror devices may phase modulate light without modulating either the amplitude or the location of the reflected beam of light. This is because the mirror 602 of the flexure beam micromirror device remains perpendicular to the direction of mirror travel. If the path of an incident light beam is perpendicular to the plane of the mirror 602, then the reflected beam will traverse the incident light path independent of the deflection of the mirror 602. Deviation of the incident light from the normal will, depending on the amount of deflection of the mirror 602, cause the reflected beam to traverse one of a number of possible parallel paths.

A light beam may be phase modulated using a flexure beam micromirror array by controlling the amount of deflection of each mirror 602 in the array. Typically an electrical control signal is used to vary the bias voltage applied to the address electrode 610 under each mirror 602 while a mirror bias signal is applied to all of the mirrors 602 in the array. This allows the deflection of each mirror to be individually and selectively controlled, thus allowing each mirror 602 to independently phase modulate the portion of the incident light beam striking its surface. As each mirror 602 is deflected, the optical path length that each reflected light beam portion must travel from its mirror 602 to the lens group 502 and, ultimately, to the mask 506 varies, thereby transversely modulating the phase of the reflected wave 501.

Figure 7:
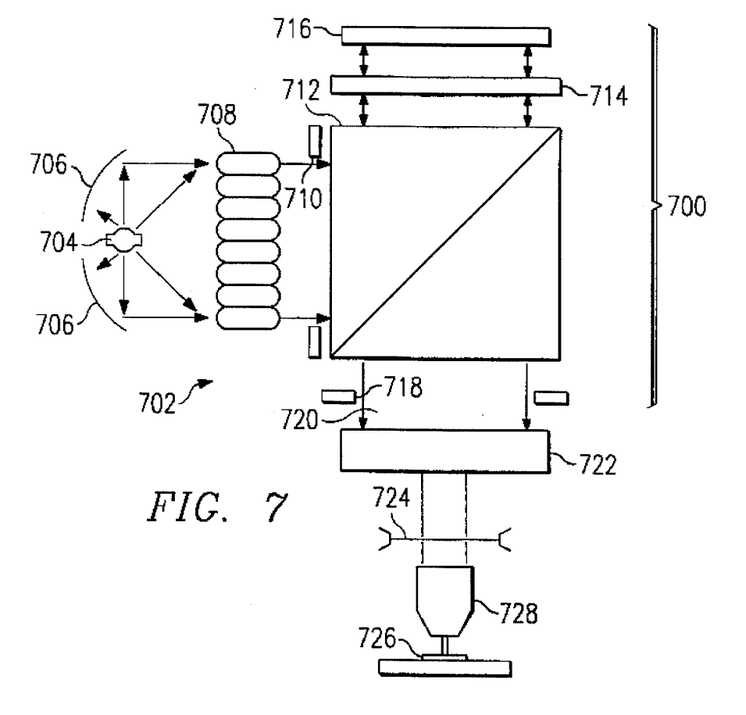
FIG. 7 is a view of a phase shift lithography system further including one embodiment of the optical components used to generate the phase modulated wavefront according to the present invention.

A flexure beam micromirror-based phase shift illuminator 700 according to one embodiment of the present invention is shown as pan of an optical lithography system 702 in FIG. 7. A light source 704 and reflector 706 are used to provide a wide beam of light for input into the homogenizer 708. The light source typically has a coherence of 30 to 60 percent. Light from the homogenizer 708 passes through an aperture 710 and enters a polarized beam splitter 712. The p-polarized component of the light beam incident on the beam splitter 712 is internally reflected by the polarized beam splitter 712 and passes through the beam splitter 712 towards a ¼ wave plate 714. The reflected beam passes through the ¼ wave plate 714 and is reflected by a phase modulator 716, in this case the micromirror array 600 of FIG. 6, before passing through the ¼ wave plate 714 a second time and reentering the beam splitter 712. Because the beam has passed through the ¼ wave plate 714 twice, its polarization has now reversed and it will pass through the beam splitter 712. After passing through the beam splitter 712, the light passes through aperture 718 before leaving the phase shift illuminator 700 and entering the remainder of lithography system 702.

The phase-modulated beam 720 leaving the illuminator 700 is the same as the input beam 501 of FIG. 5. That is, the light beam 720 is transversely phase modulated and may be considered to be comprised of multiple contiguous parallel portions or beams, each having a different phase. The phase-modulated beam 720 is then reduced in size, typically by a factor of 20, and collimated by condensing optics group 722, before impinging on lithography mask 724. The typical lithography photomask is comprised of an ultra-flat quartz plate which has a thin (800–1200 Å) layer of chromium deposited on it. After the chromium layer is deposited, it is subsequently patterned and etched to form a pattern that corresponds to the intended projected image. The chromium pattern on the mask 724 is typically five times as large as the desired pattern on the target wafer 726. The light beam passing through the lithography mask 724 is further reduced, typically by a factor of 5, and collimated by a projection lens group 728 before being projected onto the target wafer 726.

FIG. 7 only shows one possible arrangement of the components of an optical lithography system according to the present invention, there are many other possible arrangements. For example, the light beam could pass through the lithography mask before being phase-modulated, or a system could be built with only one reduction stage instead of the two stages shown in FIG. 7.

Figure 8:
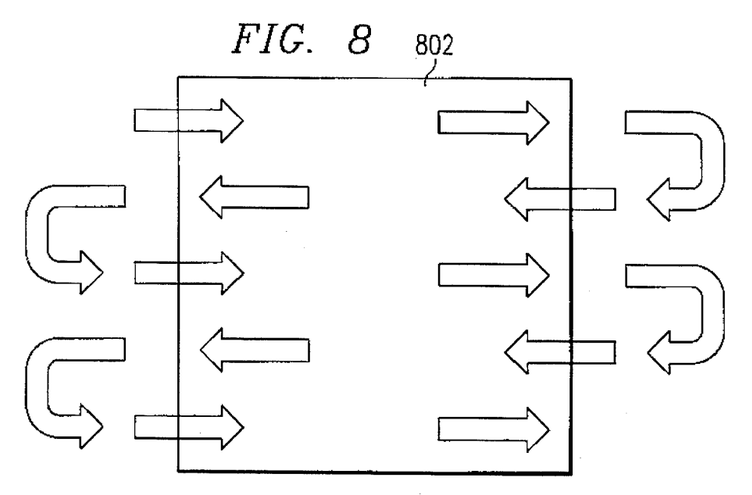
FIG. 8 is a view of one possible prior art scanning path used to image an entire lithographic mask.

The size of the beam of light modulated by each pixel or element 610 of the phase modulator 716 should be no larger than the minimum feature of the mask 724. For example, if the minimum feature size of the target wafer 726 was 0.15 μm and there was a 5× size reduction due to the projection optics 728, the minimum feature size of the lithography mask 724 would be 0.75 μm. If each element 610 in the phase modulator array 716 is 15 μm wide, then the minimum required reduction of the condensing optics group 722 would be 20×. Assuming a total reduction of 100× from the phase modulator 716 to the target wafer 726, a phase modulator 716 1 m wide would be required to image a complete integrated circuit 1 cm wide. Because it may be impractical to fabricate such a large phase modulator, a practical lithography system may simultaneously image only a portion of a chip. In order to image the entire chip, the light beam 512 could either be stepped from one portion of the chip to the next, or swept over the chip in a scanning fashion. The arrows of FIG. 8 denote one possible sweep path the modulated beam could follow to image an entire chip 802. The sweep path of FIG. 8 is simplified in that only five sweeps are shown whereas many more would typically be required.

One example of a practical lithography system could use a 1024×1024 mirror element flexure beam micromirror array as the phase modulator 716 of FIG. 7. If each mirror 602 of the array is 15 μm wide, the array is 15.36 mm wide. In order to image an entire chip 1 cm wide on target wafer 726, the light beam from the array is swept over the 5× lithography mask 724 66 times. A 1024×1024 element array contains over 1 million elements. Fabricating and controlling such a large array may prove to be unmanageable. If a smaller array is used, the number of sweeps or passes required to image a complete chip increases. For example, four abutted 256× 256 element arrays of 15 μm mirrors requires 131 sweeps over the 5× mask to completely illuminate the same 1 cm chip.

One alternative to using either a very large array or a very large number of sweeps is to only use the phase shift lithography system on portions of the circuit that require fine resolution. For example, the system could be used to fabricate only a few very small high speed transistors on a device that includes larger device geometries on the remainder of the circuitry.

A second alternative to sweeping or stepping the modulated beam over the surface of the chip is to use holographic lithography. Holographic lithography is taught in, "Holographic Mask Aligner" by F. Clube et al. (*Optical Engineering*, Vol. 32, No. 10, October 1993, pages 2403–2409), and "Submicrometer Lithography Using Lensless High-Efficiency Holographic Systems" by R. T. Chen et al. (*Optics Letters*, Vol. 15, No. 15, August 1990, pages 869–871). Holographic lithography eliminates the need for a mask and uses the phase modulator to create a holographic image which exposes the target.

In addition to enabling the use of phase shift lithography without the expense of a fixed phase shift mask, the phase shift lithography system of this invention can provide benefits that have been unobtainable with fixed phase shift masks. These benefits are due both to the fact that the phase of the light used to illuminate a given feature on a mask, and therefore the phase of the light reaching a particular point on the surface of the target wafer, is not limited to one of two discrete values, and to the fact that the phase of the light may be changed while the chip is being imaged. Typical phase shift masks of the prior art are typically made by depositing an oxide phase shifter in an aperture. Because it is extremely difficult, and therefore expensive, to vary the thickness of the oxide layer over the mask, all commercially available phase shift masks have phase shifters with the same thickness. The use of a flexure beam micromirror as a phase modulator provides the capability to incrementally vary the phase of the reflected light from one mirror to the next and over time.

Figure 9:
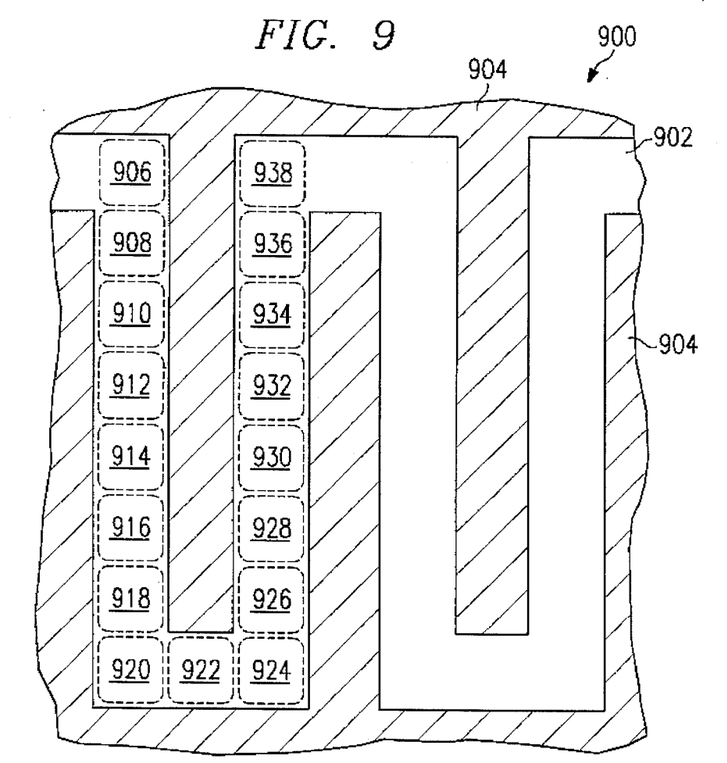
FIG. 9 is a plan view of one portion of a lithographic mask illustrating a pattern which would be difficult to image using prior art phase shifting lithography masks but may be accurately imaged by the present invention.

The ability to change the phase of light reaching a point on the target wafer can be useful when fabricating certain patterns on the target wafer. For example, the portion of a lithography mask 900 shown in FIG. 9 includes a transparent aperture 902 defined by two opaque regions 904. The pattern formed by the aperture consists of long vertical segments that are connected to adjacent segments at the top and bottom. A phase shifter would typically be used on alternating vertical segments to prevent constructive interference of the diffracted light between the segments. For example, a fixed phase shift mask may have an oxide phase shifter over the region defined by 924 through 938. The phase shifter described would result in an abrupt transition between regions 922 and 924 which may result in the border between regions 922 and 924 being unexposed due to the inadvertent destructive interference. The lithography system of the present invention can avoid the effects of inadvertent destructive interference by either using intermediate phase values, or by changing the phase of light transmitted to a given region during the exposure. If each of the regions 906 through 938 illustrated in FIG. 9 by dashed lines represented the region illuminated by one or more elements in the phase modulator 716 of FIG. 7, then the 0° to 180° phase transition between two adjacent vertical segments could be spread out among several regions. For example, if regions 908 through 918 received light having a 0° phase shift, and regions 926 through 936 received light having a 180° phase shift, then regions 920, 922, and 924 could have phase shifts of 45°, 90°, and 135° respectively. This arrangement would result in a 45° phase shift between each pair of adjacent regions and would prevent total destructive interference from occurring between any pair of regions.

A second way for a lithography system according to the present invention to avoid total destructive interference is to change the phase of some of the light during the illumination of the mask. Referring once again to FIG. 9, regions 906 through 922 receive light with a 0° phase shift while regions 924 through 938 received light with a 180° phase shift. As in the case above involving fixed phase shifters, the 180° phase transition between regions 922 and 924 causes destructive interference which might prevent the photoresist from being adequately exposed. To ensure that the region between 922 and 924 is adequately exposed, the phase of the light reaching region 922 is changed during the exposure from 0° to 180°. This causes the abrupt phase transition, and the destructive interference, to move from between regions 922 and 924 to between regions 920 and 922 thereby ensuring that each region is adequately exposed during at least a portion of the exposure period.

As discussed in the above example, each element of the phase modulator 716 may change the phase modulation it imparts to the incident light during the exposure period. As the lithography system sweeps the phase modulated light over the lithography mask, the phase modulation of each element in the array changes in order to track the relative movement of the lithography mask 724 with respect to the phase modulator 716. This results in the light passing through a given portion of an aperture having a constant phase. The phase of the light passing through some portions of an aperture may also be changed as the apertures being illuminated at a given instant changes. As a simple example, if the phase modulated light beam is swept across the lithography mask 900 of FIG. 9 from left to right, and regions 906 through 922 are illuminated with light having a 0° phase shift while regions 924 through 938 were illuminated with light having a 180 ° phase shift, as the beam of light moved to the right to the point where regions 906 through 920 are no longer illuminated, the phase of region 922 may be changed to 180° because there is no longer any need for the phase transition between regions 922 and 924.

Thus, although there has been described to this point a particular embodiment for a phase modulated illuminator and lithography method, it is not intended that such specific references be considered as limitations upon the scope of this invention except in-so-far as set forth in the following claims. Furthermore, having described the invention in connection with certain specific embodiments thereof, it is to be understood that further modifications may now suggest themselves to those skilled in the art, it is intended to cover all such modifications as fall within the scope of the appended claims.

What is claimed is:

1. An optical lithography system for projecting an image onto a target, said lithography system comprising:

a light source for projecting a beam of light along a light path;

a phase modulator disposed along said light path for imparting a phase modulation pattern transverse said beam of light, Wherein said phase modulation pattern is determined by at least one electrical control signal;

a lithography mask disposed along said light path for spatially modulating said beam of light to produce said image, said lithography mask comprised of at least two regions, a first region for preventing incident light from continuing along said light path, and a second region for allowing incident light to continue along said light path, wherein portions of said beam of light are diffracted by a boundary between said first region and said second region; and wherein said phase modulation pattern maximizes a destructive interference among said diffracted portions of said beam of light.

2. The optical lithography system of claim 1 wherein said phase modulator is a flexure beam micromirror device.

3. The optical lithography system of claim 1 further comprising a beam splitter disposed along said light path between said light source and said phase modulator.

4. The optical lithography system of claim 3 wherein said beam splitter is a polarized beam splitter.

5. The optical lithography system of claim 1 further comprising a beam splitter disposed along said light path between said phase modulator and said lithography mask.

6. The optical lithography system of claim 5 wherein said beam splitter is a polarized beam splitter.

7. The optical lithography system of claim 1 wherein said beam of light has a coherence of at least 30 percent.

8. A method of exposing a light sensitive material, said method comprising:

transversely phase modulating a beam of light in response to at least one electrical control signal;

spatially modulating said beam of light; and focusing said phase and spatially modulated beam of light onto said light sensitive material, wherein said step of transversely phase modulating maximizes a destructive interference among portions of said phase and spatially modulated beam of light.

9. The method of claim 8 wherein said step of transversely phase modulating said beam of light comprises reflecting said beam of light with a flexure beam micromirror device.

10. The method of claim 8 wherein said step of spatially modulating said beam of light comprises passing said beam of light through a lithography mask.

11. The method of claim 8 wherein said focusing step comprises focusing said phase and spatially modulated beam of light onto a photoresist.

12. The method of claim 8 further comprising the step of sweeping said focused beam of light across the surface of said light sensitive material, wherein said step of spatially modulating said beam of light further comprises varying the spatial modulation of said beam of light in concert with said sweeping step.

13. The method of claim 12 wherein said step of transversely phase modulating said beam of light further comprises varying the phase modulation of said beam of light in concert with said sweeping step.

14. A lithographic illuminator which comprises:

means for providing a beam of light;

a spatial light modulator for receiving and then reflecting said beam of light, wherein said spatial light modulator transversely phase modulates said beam of light in response to at least one electrical control signal; and means for spatially filtering said beam of light.

15. The illuminator of claim 14 further comprising a beam splitter, wherein said beam of light passes through said beam splitter before impinging on said means for transversely modulating.

16. The illuminator of claim 15 wherein said beam splitter is a polarized beam splitter.

17. The illuminator of claim 15 wherein said beam of light has a coherence of at least 30 percent.

18. The illuminator of claim 14 wherein said means for spatially filtering said beam of light is a lithography mask for receiving and spatially filtering said beam of light, said lithography mask comprising at least one aperture for allowing light to pass through said lithography mask, wherein said beam of light is diffracted by said at least one aperture and said phase modulation increases destructive interference among diffracted portions of said spatially filtered beam of light.

19. The illuminator of claim 14 wherein said spatial light modulator comprises a flexure beam micromirror device.

* * * * *